United States Patent
Chen et al.

(10) Patent No.: US 7,781,892 B2
(45) Date of Patent: Aug. 24, 2010

(54) INTERCONNECT STRUCTURE AND METHOD OF FABRICATING SAME

(75) Inventors: Hsueh-Chung Chen, Yonghe (TW); Chine-Gie Lou, Hsinchu Hsien (TW); Ping-Liang Liu, Tainan (TW); Su-Chen Fan, Ping-Jen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 307 days.

(21) Appl. No.: 11/317,652

(22) Filed: Dec. 22, 2005

(65) Prior Publication Data

US 2007/0145596 A1    Jun. 28, 2007

(51) Int. Cl.
*H01L 29/41* (2006.01)

(52) U.S. Cl. .................. 257/774; 257/773; 257/775; 257/758; 257/760; 257/E23.011; 257/E21.555; 438/622; 438/624; 438/637; 438/638; 438/667

(58) Field of Classification Search ................ 257/744, 257/E23.011, 773, 775, 758, 760, E21.555, 257/774; 438/667, 622, 624, 637, 638
See application file for complete search history.

(56) References Cited

U.S. PATENT DOCUMENTS

| | | | |
|---|---|---|---|
| 5,032,882 A | 7/1991 | Okumura et al. | |
| 5,541,425 A | 7/1996 | Nishihara | |
| 5,914,523 A | 6/1999 | Bashir et al. | |
| 5,920,790 A * | 7/1999 | Wetzel et al. | 438/618 |
| 6,440,847 B1 | 8/2002 | Lou | |
| 6,576,982 B1 * | 6/2003 | You et al. | 257/639 |
| 6,624,066 B2 | 9/2003 | Lu et al. | |
| 6,770,975 B2 | 8/2004 | Wang et al. | |
| 7,067,419 B2 | 6/2006 | Huang et al. | |
| 7,125,792 B2 * | 10/2006 | Kumar et al. | 438/637 |
| 7,214,609 B2 | 5/2007 | Jiang et al. | |
| 7,244,673 B2 | 7/2007 | Huang et al. | |
| 7,387,960 B2 | 6/2008 | Tiwari et al. | |
| 2003/0119305 A1 | 6/2003 | Huang et al. | |
| 2009/0121358 A1 | 5/2009 | Tiwari et al. | |

FOREIGN PATENT DOCUMENTS

JP    11154705 A    6/1999

(Continued)

OTHER PUBLICATIONS

Kudo, H., et al., "Copper Dual Damascene Interconnects with Very Low-k Dielectrics Targeting for 130 nm Node," IEEE, 2000, pp. 270-272.

*Primary Examiner*—Matthew E Warren
*Assistant Examiner*—John Lin
(74) *Attorney, Agent, or Firm*—Slater & Matsil, L.L.P.

(57) ABSTRACT

An improved interconnect structure and method of making such a device. The improved interconnect electrically connects two otherwise separate areas on a semiconductor wafer. The interconnect preferably uses a copper conductor disposed within a trench and via structure formed in a low-k hybrid dielectric layer using a dual damascene process. Each contact region is served by a plurality of vias, each in communication with the trench conductor portion. The entry from the trench to the via is rounded for at least one and preferably all of the via structures.

20 Claims, 8 Drawing Sheets

FOREIGN PATENT DOCUMENTS

| | | |
|---|---|---|
| JP | 2005 094008 A | 4/2003 |
| JP | 2003 197738 A | 7/2003 |
| JP | 2004 186697 A | 7/2004 |
| TW | 432613 B | 5/2001 |
| TW | 234227 B | 6/2005 |

* cited by examiner

US 7,781,892 B2

INTERCONNECT STRUCTURE AND METHOD OF FABRICATING SAME

TECHNICAL FIELD

The present invention relates generally to a semiconductor device and a method for fabricating such a device, and more particularly to fabricating an improved structure for a trench-and-via interconnect having a hybrid dielectric layer that exhibits a lower effective dielectric constant, improved heat dissipation characteristics, greater resistance to stress migration, and improved mechanical strength.

BACKGROUND

The myriad small electronic devices in use today, including computers, cellular telephones, and portable game-station, have been made possible in large part by the development of semiconductor electronics technology. Semiconductors are materials that conduct electricity only under certain conditions, which often include the presence of a small electrical charge. This enables the manufacture of solid-state switches—those that have no moving parts. Unlike former technology that relied on electromechanical switches and wires, integrated circuits made of semiconducting materials have no moving parts, take up far less space, and can operate on much less power—all desirable features for components used in modern electronic devices.

Because of their small size, semiconductor devices require a specialized fabrication process. A series of steps is used to simultaneously form a large number of components on a single work piece. The specific steps involved in fabricating a particular combination of these tiny semiconductor devices may vary, but similar general steps are employed. A material such as silicon is produced for use as a base, or substrate material. This material is then cut into an appropriate shape, typically a thin slice called a wafer. The pure silicon is then selectively treated with one or more materials called dopants, such as ionized boron or phosphorus. The introduction of these impurities begins the process of creating the desired semiconductive properties. Various structures are then formed at or near a surface of the wafer in a series of steps. These structures that will eventually make up the transistors, capacitors, and other electrical components of the particular semiconductor device.

These surface structures may be formed for example by etching, whereby the surface is exposed to an appropriate etching agent. Or, more typically, the surface is selectively etched using a process known as photolithography. In photolithography, a material called photoresist, or simply resist, is deposited and spread evenly over the wafer surface. The resist is then selectively treated with a light source directed through a patterned mask so that some portions of the resist are exposed to the light energy and others are not. The exposed portions of the photoresist are either strengthened or weakened, depending on the type of resist material used, so that the weaker portions can be washed away using a solvent that will not otherwise affect the wafer or any structures already formed on it. The resist that remains, however, will prevent the etching of the wafer surface in the still-covered areas when the etching agent is used in subsequent steps. When the desired wafer etching has been accomplished, the remaining photoresist is removed using an appropriate solvent. Etching is only one method of removing material, however, and other methods including mechanical scrubbing are also used.

Materials are added to the wafer during the fabrication process as well. Metals, other conductors, and insulators are added to the wafer surface using any of a variety of deposition methods, for example chemical vapor deposition (CVD) or sputtering. Additional ion implantation may also be performed. By selectively adding and removing these various materials, layer after layer of electrical devices can be formed on the wafer surface (or on top of previously formed structures).

A single wafer is typically used for the fabrication of a number of dice, or individual portions of the wafer that will eventually be cut apart from each other and used separately. Typically, all of the dice on a single wafer are formed identically, but this is not necessarily the case. After the fabrication is complete (and often at various intermediate steps as well), the wafer is inspected so that defective regions can be marked for discard or repair. When the dice are separated, those passing inspection are packaged, that is encapsulated in a hard plastic material and provided with external leads connected to various internal locations. The encapsulated die that has been provided with a number of leads is often referred to as a chip.

There are many types of electrical devices that can be fabricated using methods like those described above, and a single chip contains thousands, or even millions of such devices, arranged to form functioning circuits. At times it is necessary to connect one circuit or device with another one that is not immediately adjacent to it. An interconnect may be used for this purpose. A typical interconnect structure of this prior art is shown in FIGS. 1A and 1B. FIG. 1A is a cross-sectional side view of semiconductor device 100. FIG. 1B is a cross-sectional side view of semiconductor device 100, rotated 90° about a vertical axis from the view of FIG. 1A. Semiconductor device 100, formed on substrate 101, includes a first electrical circuit and a second electrical circuit, the two of which need to be connected for the device to operate. The specific function of these circuits is not relevant here, and for convenience they will be referred to as first active area 105 and second active area 110. These active areas are formed on substrate 101 in a first layer 102. Note that as used herein, the term "semiconductor device" may refer to a complete device that will function as a unit, but it will frequently also be used to refer to a component or collection of components that will make up only a small portion of such a functional unit.

An elongated conductor 115 formed in trench 116 is used to electrically connect first active area 105 and second active area 110. Elongated conductor 115 is located in interconnect layer 103, and is constructed of a conducting material such as aluminum or copper. To make sure the elongated conductor 115 does not contact any other portions of the semiconductor device (unless it is intended to do so), a dielectric material 120 surrounds it, locally filling in much of the remainder of layer 103. (Although not shown in FIGS. 1A and 1B, an insulating layer or additional interconnect structures, or both, are likely to be disposed in an additional layer above layer 103.) To establish an electrical connection with the appropriate active areas, vias 117 and 118 are formed, extending downward from trench 116, and also filled with the conductive material of elongated conductor 115. Note that in fabricating a structure such as semiconductor device 100, the trench and the vias are typically formed in a previously-deposited dielectric material and then filled with the conductor. As illustrated in FIGS. 1A and 1B, via 117 extends to contact active area 105 and via 118 extends to contact active area 110.

The interconnect of FIGS. 1A and 1B is adequate for use in many semiconductor applications. As the drive continues to design chips containing a greater number of electrical devices in smaller and smaller packages, however, problems associated with heat dissipation, stress migration, and mechanical strength, among other factors, become more pronounced. Improvement in design to deal with these problems is constantly demanded. The present invention provides just such an improvement.

SUMMARY OF THE INVENTION

These and other problems are generally solved or circumvented, and technical advantages are generally achieved, by preferred embodiments of the present invention, which is directed to an improved interconnect structure for use in semiconductor manufacturing applications.

In one aspect, the present invention is an improved interconnect structure for use in a semiconductor application, the interconnect including a first low-k dielectric layer that is disposed over a substrate having a circuit or other active area to which the interconnect will make contact. The interconnect of the present invention also includes a second low-k dielectric layer disposed over the first dielectric layer, the first and second dielectric layer thereby forming a hybrid dielectric layer in which a trench-and-via structure for the interconnect is formed. The trench-and-via structure is preferably formed so as to provide a plurality of vias for extending from the trench to at least one of the active-area contact regions being served by the interconnect. It is further preferred that a dual via structure be used for contacting as many of the contact regions served by the interconnect as possible. The entry from the trench to each individual via exhibits significant curvature to improve the strength and reliability of the interconnect structure. The trench and the vias are recesses in the dielectric materials for containing the conducting material such as copper or aluminum that will electrically connect two or more active areas to each other or to an external device. The hybrid dielectric layer in which the trench-and-via structure is formed may also include an etch stop layer disposed between the first and the second dielectric layers to facilitate the process of etching the trench and via structure.

In another aspect, the present invention is an improved method for manufacturing an interconnect in a semiconductor device including the steps of depositing a first low-k dielectric layer over a substrate having an active area and depositing over the first dielectric layer a second dielectric layer of a material that has a lower k-value than the first dielectric layer. In some embodiments, an etch step layer may be deposited after the first dielectric layer and prior to the second. The method continues with the step of etching to form a trench-and-via structure in the hybrid dielectric layer. This step may be performed as two separate etching steps, the first to substantially form the trench and the second to form the vias. The vias preferably are formed with significantly-rounded entries in the region extending from the trench to each via, and there are preferably a plurality of vias extending from the trench to each contact region associated with a substrate active region. The process continues with the step of filling the trench-and via structure with a conducting material, and may include further steps such as performing mechanical removal of any excess conducting material.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1A:
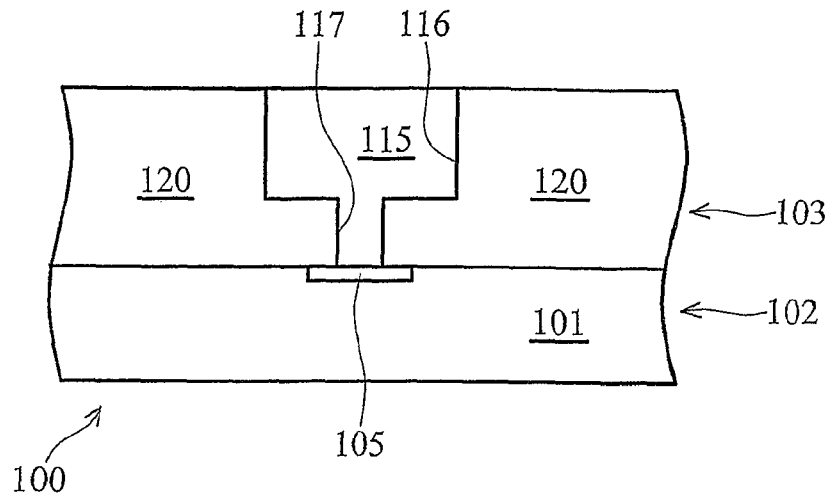
FIG. 1A is a cross-sectional side view of a typical semiconductor device of the prior art.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a trench and via structure formed in the dielectric layer of a semiconductor device, preferably using a copper conductor for the interconnection between two active areas formed on a wafer substrate. The invention may also be applied to other semiconductor devices, for example in other layers of a multi-layer fabrication or to connect multiple active areas with each other. Note that copper is a preferred material because of its conductive properties, even though special fabrication steps such as chemical mechanical polishing (CMP) may be required because it is difficult to selectively remove copper through a conventional etching process. Other conducting materials, however, may be used as well.

The dielectric layer formed over the substrate is, in accord with an embodiment of the present invention, preferably a hybrid layer including a first low-k dielectric layer and a second dielectric layer having a lower k-value than the first dielectric layer. The two layers may be separated by an etch stop layer to facilitate proper formation of the interconnect trenches and vias. The use of low-k dielectric materials is known to permit the closer spacing of conductors running within the dielectric layer, but may give rise to other problems. The use of copper, for example, in conjunction with low-k dielectrics may contribute to stress migration concerns because low-k materials have large coefficients of thermal expansion compared with copper, and low-k materials have generally poor adhesion qualities. These disadvantages, however, are addressed by the structure and method of the present invention.

The present invention is directed to an improved semiconductor, and specifically to an improved interconnect structure for use in semiconductor applications. In accordance with the present invention, an interconnect structure is preferably formed of a copper conducting element disposed in a novel trench and dual-via configuration using a damascene process. The trench and via structure of the interconnect is formed in a hybrid dielectric layer of the device including two or more sublayers of a low-k dielectric material. The improved interconnect of the present invention provides greater mechanical strength while also providing better heat-dissipation performance and greater resistance to stress migration. The structure of the improved interconnect of the present invention will now be explained in greater detail.

Constructed over a wafer substrate of silicon or some other suitable material, the interconnect of the present invention may, of course, also be present on any useful layer of a multi-layer fabrication. Its purpose, however, is to connect one active area, or one discreet circuit, with another active area or circuit. In some instances, it may also be used to interconnect more than two locations as well, or to connect one or more active areas with an external device or conductor. In any case, the interconnect structure associated with the present invention may be associated with all, or merely some or one of the contact regions served by the interconnect.

Figure 2:
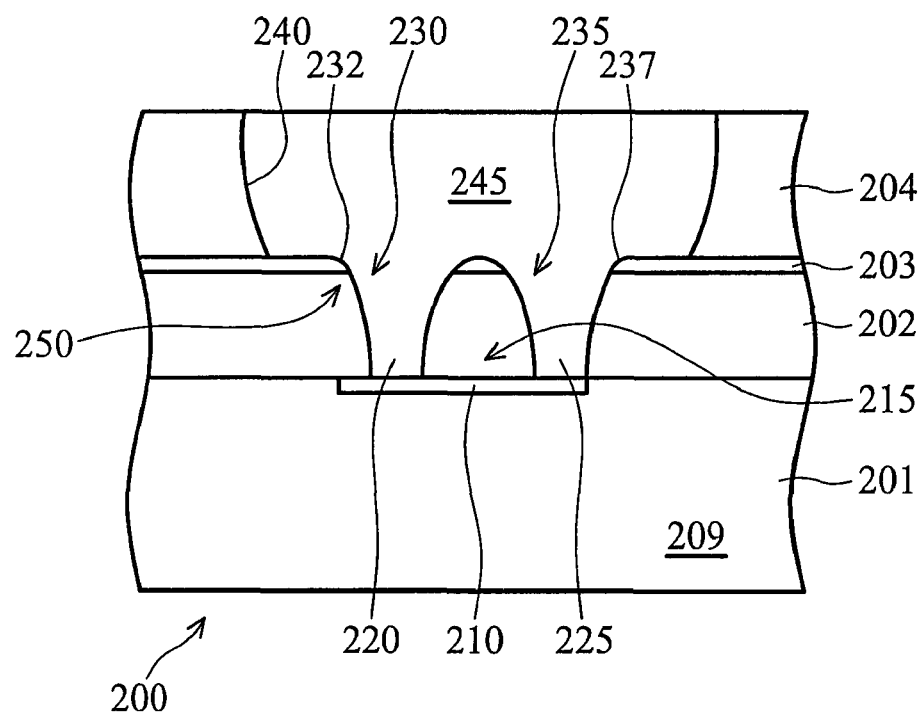
FIG. 2 is a cross-sectional side view illustrating a semiconductor interconnect according to an embodiment of the present invention.

In order to obtain the advantages of the present invention, the interconnect is preferably constructed using copper as the conductor, which is formed into a trench-and-via structure using a dual-damascene process. Other conductive materials, however, may also be used unless a particular material is specifically recited in relation to a particular embodiment. A completed structure is shown in FIG. 2. FIG. 2 is a cross-sectional view illustrating a semiconductor interconnect 200 according to an embodiment of the present invention. In the embodiment of the FIG. 2, active area 210 is formed in substrate 209 at a first layer 201. As mentioned above, however, the interconnect may also be used for other applications. For example, the contact region may simply involve a junction with another interconnect structure, perhaps one formed in a higher layer. In the embodiment illustrated in FIG. 2, the contact region 215 is the general area where the active area 210 formed in substrate 209 is served by the interconnect 200. Other contact regions, perhaps associated with other active areas, will normally be present, of course, but for simplicity are not shown in FIG. 2.

Disposed above the layer 201 containing active area 210 is situated a first dielectric layer 202, preferably formed of a material having a relatively low dielectric constant (sometimes referred to as a low-k material, or as a material having a low-k value). Low-k materials are desirable for use in the dielectric layer because they allow metal conducting features to be spaced more closely together without undue risk of signal leakage. Low-k materials are typically less dense than other dielectric materials and may be made by introducing greater porosity into the material matrix. As used herein, low-k for the dielectric components will be considered approximately 4.2 and below. Fluorinated silicate glass (FSG), for example, has a dielectric constant of about 3.7. Other materials with a low k value include carbon-doped oxide (CDO) with a dielectric constant approximately between 2.7 and 2.9 and commercially available, for example, as Black Diamond® from Applied Materials, Inc., of Santa Clara, Calif.; and a spin on polymer (SOP) with an aromatic base (k-value approximately between 2.6 and 2.9), commercially available, for example, as SiLK® from The Dow Chemical company of Midland, Mich. Other low-k materials may be used as well.

In a preferred embodiment, the dielectric constant for the first dielectric layer is between 2.9 and 4.2. Via 220 and via 225 are, in this embodiment, formed substantially within first dielectric layer 202. Note that via 220 and via 225 both serve contact region 215, creating what will be referred to herein as a double-via structure. One or more additional vias could serve this contact region as well, although the use of more than two vias for this function is not typical. It is noted that, as used herein, the term 'contact region' implies an area where both connections created by a double-via structure may, as would be expected, carry the same signal. The contact region, therefore, receives the signal through one or both vias. This provides a certain degree of redundancy so that the connection may function properly even if the conductive properties of one of the vias are less than satisfactory due to malformation or degradation.

In the embodiment of FIG. 2, etch stop layer 203 is disposed above first dielectric layer 202 and during fabrication functions to facilitate the desired etching of the trench and via structure. Where the trench-and-via structure may be properly formed without it, however, the etch stop layer 203 may not be required. Disposed above etch stop layer 203 is a second dielectric layer 204. Second dielectric layer 204 is also preferably constructed of a relatively low-k material. In the preferred embodiment, the dielectric constant of second dielectric layer 204 falls within the range of 1.0 and 2.5 but again, is preferable lower than the dielectric constant of the first dielectric layer. Trench 240 is formed substantially in the second dielectric layer 204. Note, however, that while in the embodiment of FIG. 2 the first dielectric layer 202 and the second dielectric layer 204 are approximately the same thickness, this configuration is not required. Trench 240 communicates with via 220 at entry 230. Entry 230 is simply the region at which the continuous recess forming the trench and via structure transitions from trench to via. The precise level at which the entry 230 and entry 235 are defined may vary.

Figure 1B:
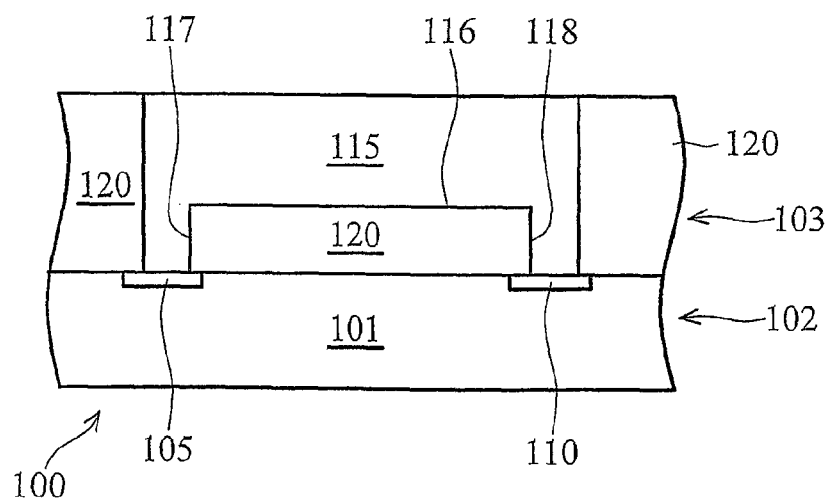
FIG. 1B is a cross-sectional side view of the semiconductor device, rotated 90° from the view of FIG. 1A.

In accordance with the present invention, entry 230 is defined by a significantly curved wall 232 (as contrasted to the abrupt square-cornered transition illustrated in the device of FIGS. 1A and 1B). The length of curved wall 232 is considered the distance along its edge from the point where a tangent to the curved wall 232 is substantially horizontal to the point where a tangent to the curved wall 232 is substantially vertical. In one embodiment, the curvature of the wall 232 may define at some point along its length a radius of curvature that is greater than the thickness of the first dielectric layer 202 or the second dielectric layer 204. Similarly, trench 240 also communicates with via 225 at entry 235, which is defined by curved wall 237. Note that although in FIG. 2 the curvature of wall 232 appears substantially the same as the curvature of wall 237, although in accordance with the present invention this similarity is not necessary unless specifically recited.

The trench-and-via structure 250 is filled with an interconnect conductor 245. Various materials may be used for interconnect conductor 245, though a metal, and specifically copper is presently preferred. The conductor 245 is preferably continuously formed (for example, deposited in a single process step) in the previously formed trenches and vias. The interconnect conductor 245 provides an electrical connection to other components (one or more) of the semiconductor device (not shown). The fabrication of an interconnect according to the present invention will now be described.

Figure 3A:
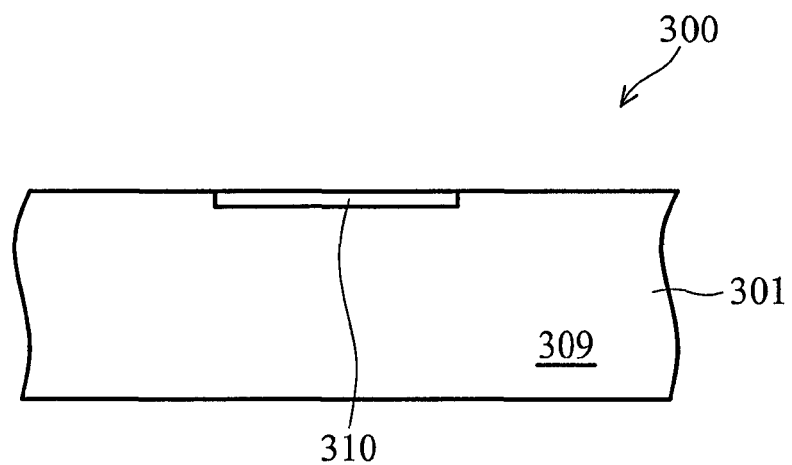
FIGS. 3A through 3I are cross-sectional side views illustrating the configuration of interconnect after each of various selected stages in its fabrication process according to an embodiment of the present invention.

FIGS. 3A though 3I illustrate the configuration of a semiconductor device 300 after each of various selected stages in its fabrication process according to an embodiment of the present invention. FIG. 3A is a cross section of a portion of a semiconductor device 300 including a substrate 309 of, for example, silicon, on which an active area 310 has been formed. The active area 310 may be a circuit, or a portion of a circuit that requires a connection to a remote component (not shown) located elsewhere. Note that the various components of semiconductor device 300 are intended to be analogous though not necessarily identical to those of semiconductor device 200 (shown in FIG. 2), and are numbered accordingly.

Figure 3B:
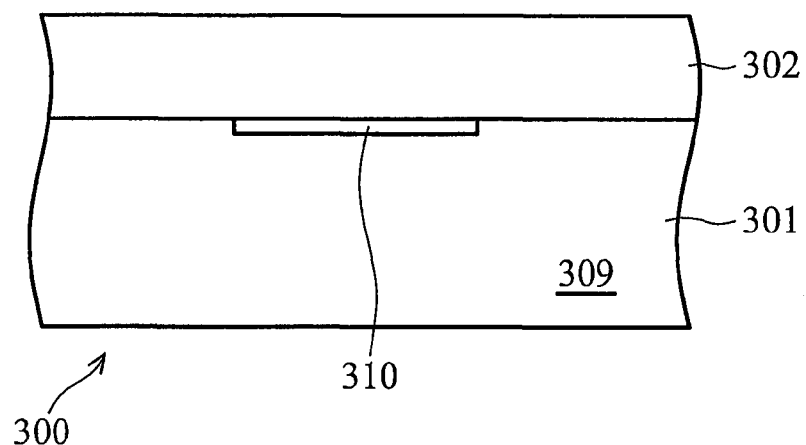
Figure 3C:
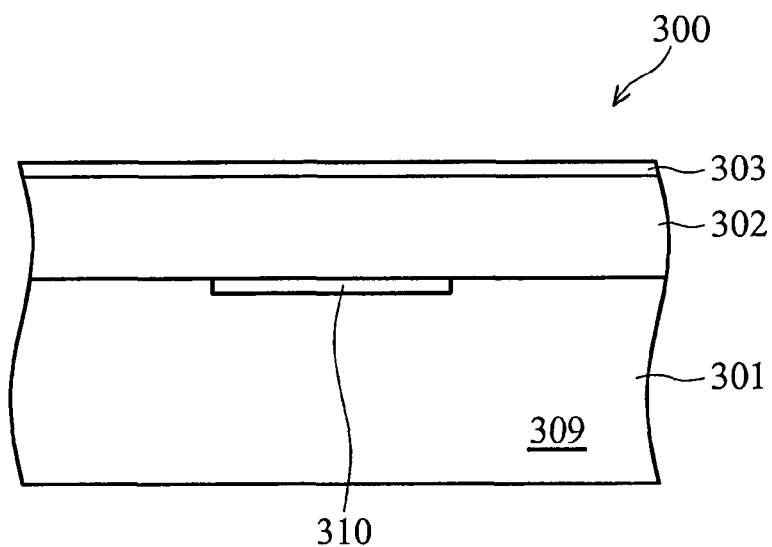
Figure 3D:
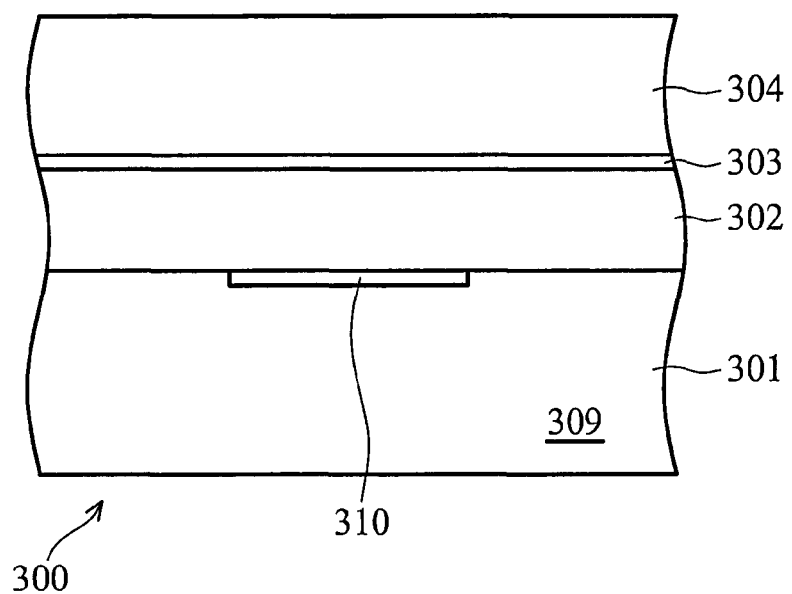

FIG. 3B is cross-sectional view of semiconductor device 300 illustrating the addition, for example by deposition, of a first dielectric layer 302. As mentioned above the first dielectric layer is preferably of a low-k material, that is, one having a relatively low dielectric constant. The vias of the interconnect will be substantially formed in the first dielectric layer 302. FIG. 3C is a cross-sectional view of semiconductor device 300 illustrating the addition of an etch-stop layer 303. In an alternate embodiment (not shown) the etch stop layer is not used and the trench and via for the interconnect is formed by other means. FIG. 3D is a cross-sectional view of semiconductor device 300 illustrating the deposition of second dielectric layer. As also mentioned above, the second dielectric layer 304 is preferably formed of a low-k material, that is, one having a relatively low dielectric constant. In a particularly preferred embodiment, the dielectric constant of the second dielectric layer 304 is lower than the dielectric constant of the first dielectric layer 302. The trench for the interconnect structure will be largely formed in the second dielectric layer 304.

Figure 3E:
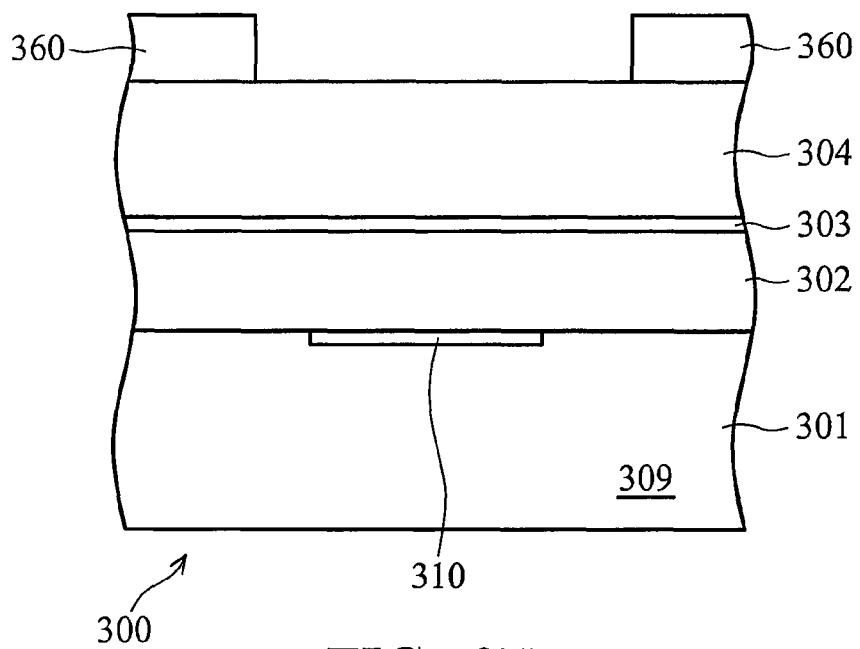
Figure 3F:
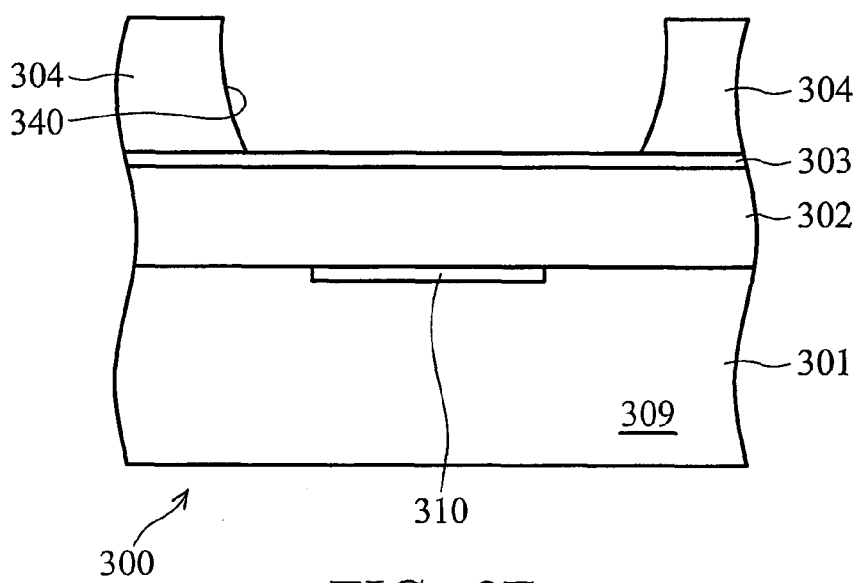
Figure 3G:
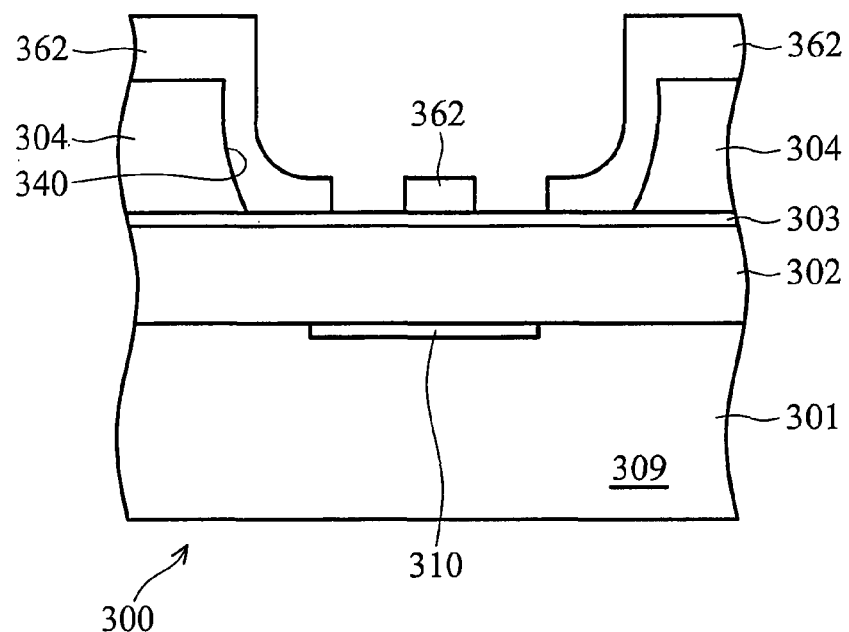

FIG. 3E is a cross-sectional view of semiconductor device 300 illustrating a layer of photoresist 360 that has been spread over the surface of the wafer and patterned in preparation for the first etching step. The resist patterning will normally be performed using some type of photolithographic process. Etching of the trench and via structure may then begin. FIG. 3F is a cross-sectional view of semiconductor device 300 illustrating the formation of trench 340 as a result of the first etching step and the subsequent removal of the remaining photoresist layer 360. A new photoresist layer 362 is then applied and patterned, as shown in FIG. 3G. A high-power etching step is then performed using an etch solution sufficient to overcome the etch-stop barrier 303. This results in the formation of via 320 and via 325, completing the trench and via structure 350 as shown in FIG. 3H that will be filled with the conducting material of the interconnect.

As with FIG. 2, entry 330 is defined by a significantly curved wall 332. The length of curved wall 332 is considered the distance along its edge from the point where a tangent to the curved wall 332 is substantially horizontal to the point where a tangent to the curved wall 332 is substantially vertical. In one embodiment, the curvature of the wall 332 may define at some point along its length a radius of curvature that is greater than the thickness of the first dielectric layer 302 or the second dielectric layer 304. Similarly, trench 340 also communicates with via 325 at entry 335, which is defined by curved wall 337. Again, that although in FIG. 3H the curvature of wall 332 appears substantially the same as the curvature of wall 337, although in accordance with the present invention, this similarity is not necessary unless specifically recited.

Figure 3H:
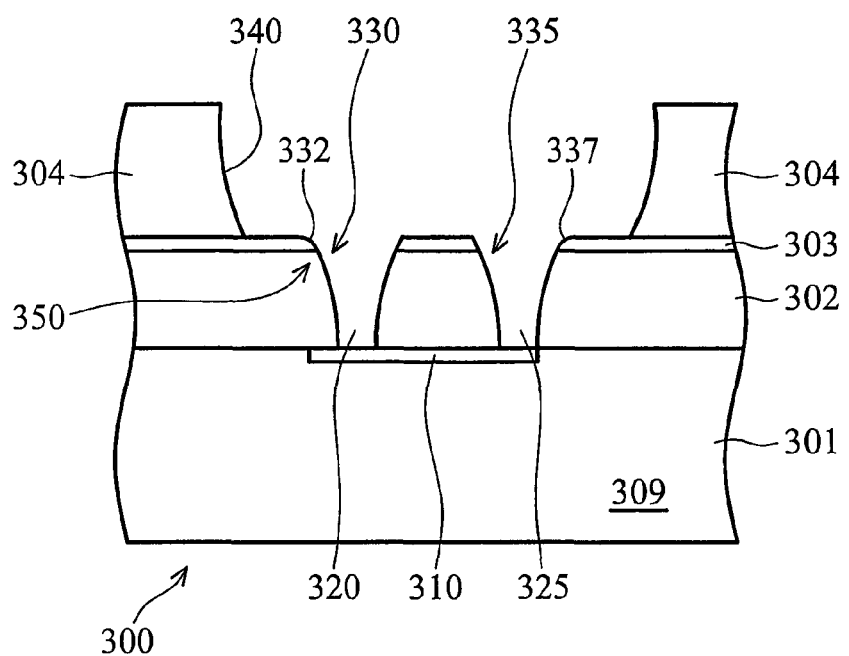
Figure 3I:
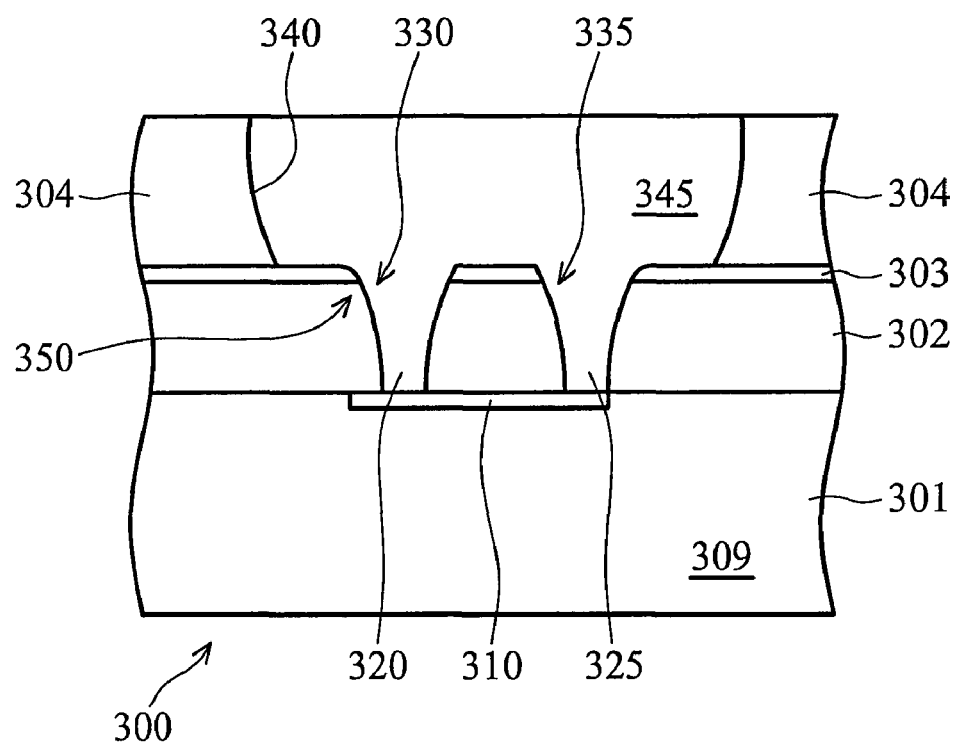

FIG. 3H is a cross-sectional view of semiconductor device 300 after performance of the high-power etching step and the subsequent removal of the photo resist layer. Finally, trench and via structure 350 is filled with a conducting material 345 such as copper or another suitable conductor. In some fabrications, this will involve depositing the metal conductor material as another layer, filling in trench and via structure 350 in the process (step not illustrated). The unwanted material outside of trench and via structure 350, that is, the metal layer overlying the rest of the second dielectric layer 304 is in then removed using, for example, a chemical-mechanical polish. Returning to the illustrated embodiment, FIG. 3I is a cross-sectional view illustrating the completed interconnect of semiconductor device 300 after the conducting material 345 has been formed in the trench and via structure.

Figure 4:
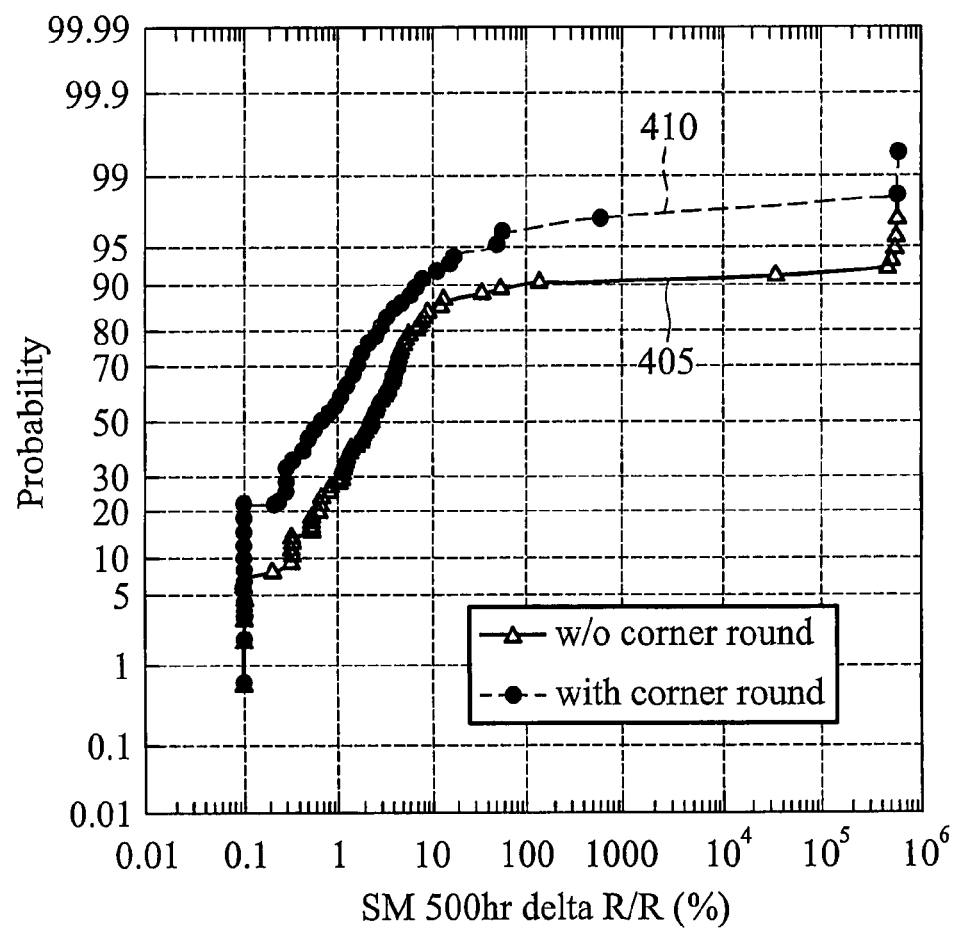
FIG. 4 is a graph illustrating the superior stress migration performance of interconnects using a via and trench structure with a rounded entry region.

In this manner, the structural integrity of a dual damascene trench-and-via interconnect is enhanced notwithstanding the use of a copper conductor in conjunction with a low-k dielectric layer, which permits closer spacing of the conductor relative to other conductors of the semiconductor device. The use of a rounded entry region where the interconnect trench transitions into each via greatly relieves the stress migration near the region despite differences in the coefficients of thermal expansion exhibited by the disparate materials. Better performance and reduced performance degradation over time generally result. This advantage is borne out by experience, at least experimentally. For example, FIG. 4 is a graph 400 illustrating the superior stress migration-related performance of interconnects using a via and trench structure with a rounded entry region. Curve 405 is representative of such structures formed without rounded entry regions, that is, without the advantages afforded by practicing embodiments of the present invention. As should be apparent from graph 400, this curve 405 is significantly below curve 410, which represents the performance of interconnects that are nearly identical but use rounded entry regions between via and trench. This is due at least in part to alleviation of a stress concentration at the bottom of the via.

When used together with the trench and via interconnect formed with a rounded entry region, the hybrid dielectric layer further enhances the interconnect reliability, especially when, as is preferred, the k-value of the dielectric layer forming the trench is less than the k-value of the dielectric value forming the vias. In this embodiment the difference in coefficients of thermal expansion can be minimized and better heat dissipation is provided while at the same time permitting the closer spacing of the trench portion of the conductive material with other, similar structures. The use of the preferred dual via structure enhances interconnect reliability and performance as well.

Although the present invention and its advantages have been described in detail, it should be understood that various changes, substitutions and alterations can be made herein without departing from the spirit and scope of the invention as defined by the appended claims. For example, it will be readily understood by those skilled in the art that the materials and process steps described above may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnect structure for a semiconductor device, comprising:
   an elongated conductor formed in a trench, the trench being formed in a second-layer dielectric material having a low dielectric constant;
   a plurality of vias terminating on a same underlying contact; and
   a rounded corner at an intersection between each of the plurality of vias and the trench;
   wherein the plurality of vias is formed in a first-layer dielectric material having a low dielectric constant, wherein the rounded corner exhibits a radius of curvature greater than a thickness of the first-layer dielectric material.

2. The interconnect structure of claim 1, wherein the first-layer dielectric material has a different dielectric constant than the second-layer dielectric material.

3. The interconnect structure of claim 2, wherein the dielectric constant of the first-layer dielectric material is less than 4.2.

4. The interconnect structure of claim 2, wherein the dielectric constant of the first-layer dielectric material is greater than 2.2.

5. The interconnect structure of claim 4, wherein the dielectric constant of the first-layer dielectric material is less than 4.2.

6. The interconnect structure of claim 2, wherein the dielectric constant of the first-layer dielectric material is greater than the dielectric constant of the second-layer dielectric material.

7. The interconnect structure of claim 2, wherein the dielectric constant of the second-layer dielectric material is less than 2.9.

8. The interconnect structure of claim 2, wherein the dielectric constant of the second-layer dielectric material is greater than or equal to 1.0.

9. The interconnect structure of claim 8, wherein the dielectric constant of the second-layer dielectric material is less than 2.5.

10. The interconnect structure of claim 1, wherein the elongated conductor and the plurality of vias are copper.

11. The interconnect structure of claim 1, further comprising an etch stop layer disposed between the first-layer dielectric material and the second-layer dielectric material.

12. A semiconductor device, comprising:
a substrate comprising a contact region;
a first dielectric layer formed of a first-layer dielectric material having a value between 2.9 and 4.2, inclusive, overlying the substrate;
a dual via structure formed in the first dielectric layer;
a second dielectric layer formed of a low-k material having a k-value between 1.0 and 2.5, inclusive, overlying the first dielectric layer; and
a trench formed in the second dielectric layer;
wherein vias of the dual via structure and the trench intersect at a rounded corner, and wherein the rounded corner exhibits a radius of curvature greater than a thickness of the first-layer dielectric material, and wherein the trench and the vias are filled with a conducting material that is in electrical contact with the contact region.

13. An interconnect structure for a semiconductor device, comprising:
an elongated conductor formed in a trench, the trench being formed in a second-layer dielectric material having a low dielectric constant;
a dual via structure terminating on a same underlying contact; and
a rounded structure separating vias of the dual via structure and intersecting the trench;
wherein the dual via structure is formed in a first-layer dielectric material having a low dielectric constant, wherein the rounded structure exhibits a radius of curvature greater than a thickness of the first-layer dielectric material.

14. The interconnect structure of claim 13, wherein the dielectric constant of the first-layer dielectric material is less than 4.2.

15. The interconnect structure of claim 13, wherein the dielectric constant of the first-layer dielectric material is greater than 2.2.

16. The interconnect structure of claim 15, wherein the dielectric constant of the first-layer dielectric material is less than 4.2.

17. The interconnect structure of claim 13, wherein the dielectric constant of the first-layer dielectric material is greater than the dielectric constant of the second-layer dielectric material.

18. The interconnect structure of claim 13, wherein the dielectric constant of the second-layer dielectric material is less than 2.2.

19. The interconnect structure of claim 13, wherein the dielectric constant of the second-layer dielectric material is greater than or equal to 1.0.

20. The interconnect structure of claim 19, wherein the dielectric constant of the second-layer dielectric material is less than 2.2.

* * * * *

UNITED STATES PATENT AND TRADEMARK OFFICE
CERTIFICATE OF CORRECTION

PATENT NO. : 7,781,892 B2  Page 1 of 1
APPLICATION NO. : 11/317652
DATED : August 24, 2010
INVENTOR(S) : Chen et al.

It is certified that error appears in the above-identified patent and that said Letters Patent is hereby corrected as shown below:

In Col. 9, line 31, claim 12, delete "value" and insert --k-value--.

Signed and Sealed this

Twelfth Day of October, 2010

David J. Kappos
*Director of the United States Patent and Trademark Office*